United States Patent [19]

Waters et al.

[11] Patent Number: 4,468,794
[45] Date of Patent: Aug. 28, 1984

[54] DIGITAL COHERENT DETECTOR

[75] Inventors: William M. Waters, Millersville, Md.; Bobby R. Jarrett, Fredericksburg, Va.

[73] Assignee: The United States of America as represented by the Secretary of the Navy, Washington, D.C.

[21] Appl. No.: 338,396

[22] Filed: Jan. 11, 1982

[51] Int. Cl.³ .......................................... H04B 15/00
[52] U.S. Cl. ................................. 375/103; 364/724
[58] Field of Search ............... 364/724, 715, 825, 514, 364/602; 375/103, 11-15; 329/124, 50, 104; 333/28 R, 18, 165

[56] References Cited

U.S. PATENT DOCUMENTS

| | | | |
|---|---|---|---|
| 4,035,735 | 7/1977 | Akashi et al. | 329/50 |
| 4,096,576 | 6/1978 | Takashi et al. | 364/825 |
| 4,105,981 | 8/1978 | Lechevir et al. | 329/50 |
| 4,121,165 | 10/1978 | Doglilotti et al. | 329/50 |
| 4,285,061 | 8/1981 | Ho | 364/724 |
| 4,349,916 | 9/1982 | Roeder | 375/103 |
| 4,376,308 | 3/1983 | McNair | 375/14 |

Primary Examiner—Gary Chin
Assistant Examiner—Thomas G. Black
Attorney, Agent, or Firm—Robert F. Beers; William T. Ellis

[57] ABSTRACT

A digital coherent detector for sampling a band-limited IF signal directly to obtain its in-phase and quadrature coefficients I(t) and Q(t) without using quadrature channels comprising:

an A/D converter for sampling and digitizing an IF signal $r(t) = I(t) \cos 2\pi f_o t - Q(t) \sin 2\pi f_o t$ at a sampling frequency of $f_s = 2f_o/(M-\frac{1}{2}) = 2W$, where M is an integer, W is the bandwidth of the input signal, and $f_o$ is the center frequency of the signal, so that the sin and cos sinosoidal terms alternately go to zero and one respectively, thereby alternately yielding the sample values I(t) and then Q(t);

a finite impulse response digital filter for estimating the value $\hat{r}(t)$ for the coefficient whose sinosoidal term has gone to zero in a given sample with the function $$\hat{r}(t) = \sum_{-N}^{N} r(n/2W) s(t - n/2W)$$

where $s(t-n/2W)$ is a self truncating interpolation function; and a switching circuit for properly setting the signs for $r(t_m)$ and $\hat{r}(\sim t_m)$ and switching these terms between I and Q output lines in accordance with a sampling clock pulse.

12 Claims, 4 Drawing Figures

DIGITAL COHERENT DETECTOR

BACKGROUND OF THE INVENTION

The present invention relates generally to the field of coherent signal detection, and more particularly to a digital coherent detector for directly sampling and digitizing an IF signal.

Receiving systems and radar receiving systems in particular, generally are designed to process their received signals at baseband in order to reduce the required A/D sampling rate. However, in order to obtain the information baseband, received intermediate frequency (IF) signals must be beat or heterodyned with a local oscillator intermediate frequency signal. Because the intermediate frequency signal could have any phase at the time of reception by the receiver, proper processing requires the generation of I and Q signals in phase quadrature in order to obtain phase and amplitude information. Phase accuracy, where the phase $\emptyset$ is defined as $\text{Tan}^{-1} Q/I$, is dependent upon careful matching of these separate quadrature channels. Accordingly, phase errors limit the performance achievable from subsequent digital processing circuits such as MTI and DSLC. More specifically, the presently utilized method of forming two quadrature channels requires two separate frequency translations in parallel. The base-band mixers utilized in these frequency translations must track each other in order to obtain the desired phase accuracy. However, even a good pair of phase detectors for the I and Q channels will contribute a 2-4 degree error. Accordingly, such conventional baseband I/Q detection system will have a minimum of a 2-4 degree phase error which will inherently limit sidelobe cancellation ratios to about 30 dB. Thus, it can be seen that the phase error inherent in this quadrature channel approach presents significant limitations on radar signal processing.

OBJECTS OF THE INVENTION

Accordingly, it is an object of the present invention to significantly increase the phase accuracy obtained in the coherent detection of a signal.

It is a further object of the present invention to eliminate the requirement for IF-to-baseband conversion in a coherent detector.

It is yet a further object of the present invention to directly detect IF signals in a coherent detector.

It is still a further object of the present invention to significantly reduce the hardware and cost in implementing a digital coherent detector for IF.

It is yet a further object of the present invention to significantly increase the sidelobe cancellation ratio of a radar system.

Other objects, advantages, and novel features of the present invention will become apparent from the detailed description of the invention, which follows the summary.

SUMMARY OF THE INVENTION

Briefly, the foregoing objects are achieved in a digital coherent detector comprising:

a circuit for sampling and digitizing an IF signal $r(t) = I(t) \cos 2\pi f_0 t - Q(t) \sin 2\pi f_0 t$ at a sampling frequency of $f_s = 2f_0/(M - \frac{1}{2})$ where M is an integer, $I(t)$ and $Q(t)$ are the in-phase and quadrature coefficients of the signal, respectively, and $f_0$ is the center frequency of the signal, so that the sin and cos sinosoidal terms alternately go to zero and one, respectively, at each sample point $t_m = m/f_s (m=0,1,2 \ldots)$ such that samples of $r(t)$, namely $r(t_m)$, are alternately equal to $I(t_m)$ and then $Q(t_m)$;

an estimating circuit for determining an estimate $\hat{r}(t)$ for the I or Q coefficient whose sinosoidal term has gone to zero in a given sample;

an I output line;

a Q output line, and a switching circuit for alternately switching the terms $r(t_m)$ and $\hat{r}(t_m + \frac{1}{4}f_0')$ between the I and Q output lines in accordance with the sampling frequency clock pulse. The estimating circuit may be conveniently realized by a finite impulse response digital filter capable of calculating the function $$\hat{r}(t) = \sum_{n=-N+J}^{n=N+J} r(n/2W) s(t_n - n/2W)$$

wherein $W = f_s/2$ is the spectral width of the interpolation function $s(t_n - n/2W)$, J is the largest integer less than $(t_n + \frac{1}{2})$, n is the summation index value, and the calculation is made on the N preceding and N succeeding samples for a given $r(t_m)$. The estimate $\hat{r}(t_m + \frac{1}{4}f_0')$ should be made at the times $t_m + \frac{1}{4}f_0'$ where $f_0' = (2M' - 1)W/2$, and M' is an integer $M' >> M$. The larger M' is, the closer the interpolated estimate $\hat{r}(t_m + \frac{1}{4}f_0')$ will be to the actual value of the missing coefficient as long as $\hat{r}$ is a sufficiently good estimate of r.

In a preferred embodiment, the sampling function $s(t - n/2W)$ may be the self truncating function $$s(t - n/2W) = \frac{\sin(2\pi \, q/p)W(t - n/2W)^P}{(2\pi \, q/p)W(t - n/2W)} \cdot$$

$$\frac{\sin (2\pi \, MW(t - n/2W)) - \sin (2\pi \, (M - 1)W(t - n/2W))}{2\pi \, W(t - n/2W)}$$

where $Q = 1 - B/W$, B = input signal bandwidth, $p = \text{INT}(Nq\pi/e)$, and e is the natural logarithm base. The use of this self truncating function will provide an additional increase in the accuracy of the estimate $\hat{r}(t_m + \frac{1}{4}f_0')$ beyond that available from a more direct approach involving the bandpass sampling function formed from two sin x/x functions which appear in fundamental sampling theory equations.

Typically, the switching circuit will also include means for assigning the proper signs to $r(t_m)$ and $\hat{r}(t_m + \frac{1}{4}f_0')$.

If the FIR digital filter is implemented with a 2N+1 stage shift register and a plurality of adders and ROM multipliers, then a design is disclosed for significantly reducing the required ROM storage by splitting the digital word representing bandlimited IF signal r(t) into two separate reduced bit functions $r_1(t)$ and $r_2(t)$ which may be processed by low bit capacity ROM multipliers. The ROM products may then be added to yield the desired $\hat{r}(t_m + \frac{1}{4}f_0')$ term.

DETAILED DESCRIPTION OF THE PREFERRED EMBODIMENT

Figure 1:
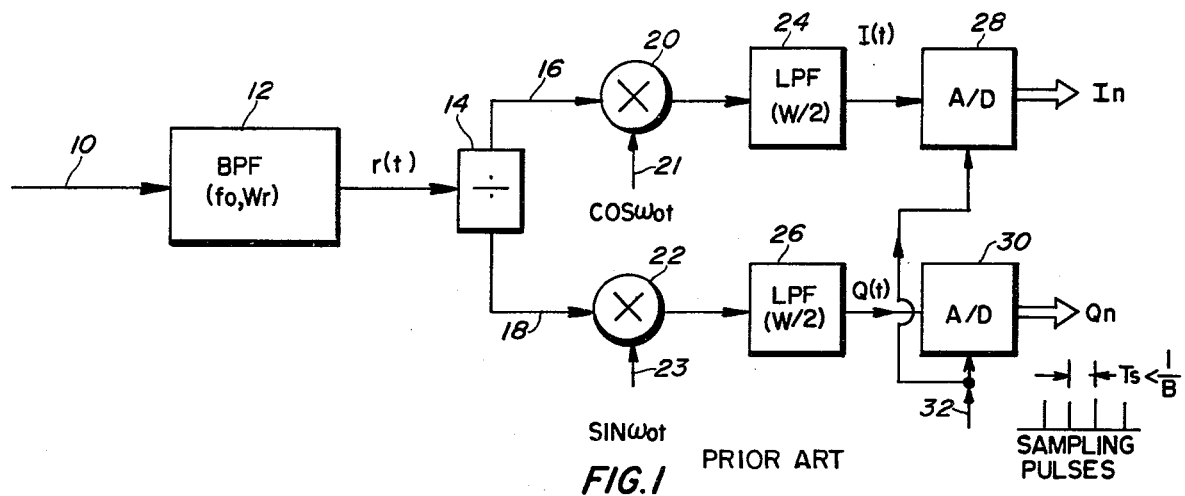
FIG. 1 is a schemmatic diagram of a conventional coherent detection system utilizing quadrature down-conversion channels.

In a typical receiving system, an incoming signal will be converted to an IF signal and then bandpass filtered. The resultant bandpass signal, r(t), may be written $$r(t) = A(t) \cos (\omega_o t + \phi (t)) \quad (1)$$

$$= A(t) \cos \phi (t) \cos \omega_o t - A(t) \sin \phi (t) \sin \omega_o t$$

$$= I(t) \cos \omega_o t - Q(t) \sin \omega_o t \quad (2)$$

where $\omega_o = 2\pi/T = 2\pi f_o$, T is the period for the signal, and $\phi$ (t) is a phase angle. It can be seen that equation (2) defines the in-phase and quadrature components of the signal, with I(t) and Q(t) being the in-phase and quadrature coefficients therefor. Prior art detection systems of the type shown in FIG. 1 are designed around equation (2). This system is designed to convert the IF signal to baseband prior to sampling. To this end an incoming IF signal on line 10 is applied to a bandpass filter 12 with a center frequency $f_o$ and a bandwidth W. The bandpass output signal r(t) from filter 12 is applied to a splitter 14 wherein the signal is equally divided between an I channel on line 16 and a Q channel on line 18. The divided IF signals on the lines 16 and 18 are then heterodyned with local oscillator intermediate frequency signals identical in frequency but in quadrature phase relationship in the mixers 20 and 22, respectively. In particular, the mixer 20 multiplies the IF signal on line 16 with the cos $\omega_o t$ signal on line 21 to yield an in-phase or I signal. Likewise, the mixer 22 multiplies the IF signal on the line 18 with the sin $\omega_o t$ signal on line 23 to yield a quadrature or Q signal. The I and Q signals are then filtered in the low pass filters 24 and 26, respectively, having bandwidths of W/2. Finally, the filtered signals are sampled by the A/D converters 28 and 30, respectively, in accordance with the sampling rate from line 32.

From the above, it is quite evident that if the mixers 20 and 22 do not track each other, then when the phase $\phi = \text{Tan}^{-1}$ Q/I is calculated, there will be significant phase error therein.

In order to circumvent this phase error problem, a system has been designed which directly samples the signal at IF without mixing the signal with quadrature phased local oscillator signals. More specifically, an all digital system has been designed for deriving in-phase and quadrature samples, $I_m$ and $Q_m$, from samples of the original signal taken directly from the IF signal. The system is based on a number of unique features including the sampling of the incoming IF signal at the frequency $f_s = 2f_o/(M - \frac{1}{2}) = 2W$ where $f_o$ is the center frequency for the signal r(t), and W is the signal bandwidth, and M is an integer. This sampling rate causes samples to be taken at the times $$t_m = m \left( \frac{M}{2f_o} - \frac{1}{4f_o} \right)$$

and thus forces the sin and cos sinosoidal terms to go alternately to zero and one, respectively, to thereby alternately give the values $I(t_m)$ and $Q(t_m)$. An interpolation device is then utilized to generate an estimate $\hat{r}(t_m)$ for the coefficient whose sinosoidal term has gone to zero in a given sample.

Figure 2:
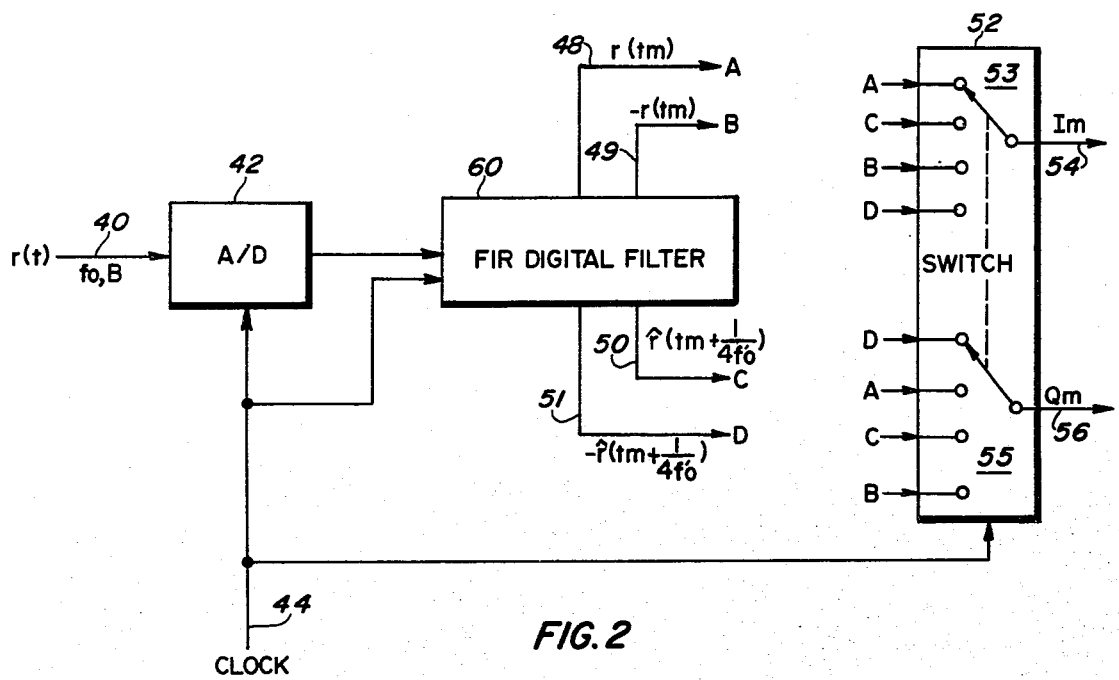
FIG. 2 is a block diagram of one embodiment of the digital coherent detector of the present invention.

FIG. 2 sets forth the basic block diagram for the digital coherent detector of the present invention. An incoming band-limited IF signal with a center frequency of $f_o$ and a bandwidth B and which may be defined as r(t) = I(t) cos $\omega_o t$ − Q(t) sin $\omega_o t$ is applied via the line 40 to an analog-to-digital converter 42. This A/D converter 42 functions to sample and digitize the analog IF bandpass signal r(t) in accordance with a clock signal on line 44. As noted above, this clock signal has the frequency $$f_s = 2f_o/(M - \tfrac{1}{2})$$

which causes samples to be taken at the times $t_m$ where $t_m$ is defined as $$t_m = m \left( \frac{M}{2f_o} - \frac{1}{4f_o} \right),$$

and where m is an integer. In essence, a sample is taken an integer number of half cycles plus one quarter cycle, $\pi/2$. It can be seen that this sampling frequency is unique in that it causes the cos and sin sinosoidal terms alternately to go to zero and one, respectively, thereby alternately yielding $I(t_m)$ and $Q(t_m)$. For example, for the first sample with m = 1, and M = 1, $t_1 = m(\tfrac{1}{4}f_o) = \tfrac{1}{4}f_o$. Thus, cos $\omega_o t_1$ = cos $2\pi f_o/4f_o$ = 0
sin $\omega_o t_1$ = sin $2\pi f_o/4f_o$ = 1.

Accordingly, the sample r(t$_1$) taken at the time t$_1$ will be $$r(t_1) = (I(t))(0) - (Q(t))(1) = Q(t)$$

For the second sample with m = 2, $$t_2 = m(\tfrac{1}{4}f_o) = \tfrac{1}{2}f_o.$$

Thus,
cos $\omega_o t_2$ = cos $2\pi f_o/2f_o$ = −1
sin $\omega_o t_2$ = sin $2\pi f_o/2f_o$ = 0
Accordingly, the sample r(t$_2$) taken at the time t$_2$ will be $$r(t_2) = (I(t))(-1) - (Q(t))(0) = -I(t)$$

Thus, it can be seen that sampling at this rate will provide an r(t) equal to either I(t) or Q(t). However, there is an additional well known limitation which must be taken into account in setting the sampling rate $f_s$. More specifically, in order to exactly reconstruct by interpolation a signal r(t) having no spectral energy beyond a system limit W, a sequence of samples must be taken at a uniform rate greater than or equal to 2W, i.e. by samples spaced $\tfrac{1}{2}$W apart or less. This is the familar Nyquist sampling theorem. In this regard, it is well known that the spectrum of a sequence of samples consists of replicas of the spectrum of the function being sampled distributed uniformly in frequency at intervals $1/T_s$ in both the positive and negative directions where $T_s$ is the sampling period. In order to prevent the positive and negative portions of the spectrum replicas from overlapping, and in order to facilitate the exact reconstruction of the signal r(t) by interpolation, the center frequency for the signal must satisfy the following additional equation:

$$f_o = (2M-1)W/2$$

such that $f_s 2f_o/(M-\frac{1}{2}) \geq 2W$. it should be noted that this is not a significant limitation on bandwidth since the IF center frequency $f_o$ can be chosen over a broad range.

A variety of state-of-the-art A/D converters are available on the market capable of sampling IF at the foregoing rates, such as, for example, the Model 7105 A/D converter from Computer Laboratories, Inc. Typically, aperture times on the order of 10 ps are available making possible the sampling of a 15 MHz carrier to an accuracy of 10 bits.

It is apparent from the foregoing that one of the sinosoidal terms, cos or sin, will always be zero using the above set forth sampling rate equations. However, this does not mean that the coefficient I(t) or Q(t) for that sinosoidal term will also be zero. Accordingly, some means must be set forth for interpolating or making an estimate of the missing term whose sinosoidal function has gone to zero. This interpolation may be accomplished by utilizing the N preceding and N succeeding samples for a sample time $t_m$ of interest and computing an estimate of an intermediate value of t in accordance with a desired sampling function for each of these 2N+1 samples. These 2N+1 values are then summed to yield an estimate $\hat{r}(t)$. This interpolating or estimating means may be implemented by a finite impulse response (FIR) digital filter 48 which stores 2N+1 samples. In essence, this technique is based on the well known fact that if an incoming signal r(t) has no spectral energy beyond a limit W, then all of the information about the signal may be found from a sequence of samples taken at a uniform rate greater than 2W (the Nyquist theorem). Stated in another way, the incoming signal may be exactly reconstructed by an interpolation $$r(t) = \sum_{-N}^{N} r(n/2W)s(t - n/2W)$$

where n is the summation index value.

Since the incoming IF signal is a band limited signal, the sampling function, s(t) must equal the impulse response of a bandpass filter. It is known that if the sample spacing $T_s = \frac{1}{2}W$, then an r(t) may be exactly recovered by means of an ideal low-pass filter having the well known impulse response $$s(t) = (\sin 2\pi Wt)/2\pi Wt$$

where $T_s = \frac{1}{2}W$.

For a bandpass signal with a spectrum confined to the band (M−1)W to MW, the appropriate sampling function can be realized by subtracting the impulse responses for two ideal low pass filters, i.e.

$$s(t) = (\frac{1}{2}\pi Wt)(\sin 2\pi MWt - \sin 2\pi (M-1)Wt)$$

where M is an integer.

The above set forth bandpass sampling function provides very good sampling accuracy with an rms phase error of approximately 1 degree using reasonable values of N (about 10). However, this phase error due to truncation may be reduced even further. In this regard, Helms and Thomas in their paper "Truncation Error Sampling Theorem Expansions," Proceedings IRE, Vol. 50, No. 2, February 1962, have shown that such truncation error, $\hat{r}(t) - r(t)$, for the canonical low-pass sampling expansion $$\hat{r}(t) = \sum_{-N+J}^{N+J} r\left(\frac{n}{2W}\right) \frac{\sin 2\pi W(t - n/2W)}{2\pi W(t - n/2W)}$$

can be reduced by appropriate modification to obtain a self-truncating interpolation where the upper bound on the truncation error decreases more rapidly with N than does the canonical sampling expansion, where J=Integer(t+0.5). The Helms and Thomas result has been extended to the bandpass case to yield the following sampling function, s(t−n/2W), $$s(t - n/2W) = \frac{\sin 2\pi(q/p)W(t - n/2W)}{2\pi(q/p)W(t - n/2W)} \quad \cdot \quad (3)$$

$$\frac{\sin 2\pi MW(t - n/2W) - \sin 2\pi(M-1)W(t - n/2W)}{2\pi W(t - n/2W)}$$

where q=1−B/W, B=signal bandwidth, W=interpolation bandwidth, and p=Int (Nqπ/e), with e being the natural logarithm base.

The estimated value would then be obtained using the equation $$\hat{r}(t) = \sum_{-N+J}^{N+J} r(n/2W)s(t - n/2W). \quad (4)$$

Using this self truncating interpolation, it is possible to obtain at least an order of magnitude improvement in interpolation to yield phase errors of 0.1–0.2 degrees.

However, if the foregoing function for $\hat{r}(t)$ is calculated right on the sample point, then the desired coefficient term I or Q to be interpolated will go to zero as discussed previously. Accordingly, the estimate $\hat{r}(t)$ is calculated slightly off of the sampling point of m/2W by the amount $\frac{1}{4}f_o'$, where $f_o'$ is defined identically as $f_o$, namely $$f_o' = 2(M'-1)W/2$$

where M' is an integer satisfying the inequality M'>>M. (M is generally small to minimize sampling operation errors.). The higher the $f_o'$ frequency, the closer the estimate $\hat{r}(m/2W + \frac{1}{4}f_o')$ comes to the actual value of the missing coefficient for r(m/2W). Calculating the function $\hat{r}(m/2W + \frac{1}{4}f_o')$ essentially moves the sampling point by a quarter cycle, thus causing the other sinosoidal coefficient to go to zero. Accordingly, the missing coefficient term will be clearly realized by calculating the function r(t) of equation (4) for a $t = t_m + \frac{1}{4}f_o'$. The high carrier $f_o'$ essentially moves the calculation time $t_m + \frac{1}{4}f_o'$ right next to the time of interest $t_m$, but it is actually 90° or $\frac{1}{4}f_o'$ away from $t_m$.

For example, for the sample $t_1$ where m=1, $$r(t_1) = (I(t))(0) - (Q(t))(1) = Q(t)$$

$$\hat{r}(t_1 + \frac{1}{4}f_o') = I(t)(1) - (Q(t))(0) = I(t).$$

Likewise, for $t_2$ where m=2

$$r(t_2) = (I(t))(1) - (Q(t))(0) = I(t)$$

$$r(t_2 + \tfrac{1}{4}f_o') = (I(t))(0) - (Q(t))(1) = Q(t)$$

It can thus be seen that the digital filter 46 will provide a pair of output coefficient values representing the I(t) and Q(t) coefficients for the function r(t). More specifically, line 48 will provide the sampled value $r(t_m)$, while the line 50 will provide the estimated value $\hat{r}(t_m + \tfrac{1}{4}f_o')$.

As noted above, since the sin and cos sinosoidal terms alternately go to zero and one, respectively, the sampled value $r(t_m)$ will alternately be I(t) and then Q(t). Thus, the output signal from line 48 must be alternately switched between an $I_m$ output line 54 and a $Q_m$ output line 56. Likewise, since the calculated estimate value $\hat{r}(t_m + \tfrac{1}{4}f_o')$ will alternately be an estimate of Q(t), and the I(t), the output estimate signal on line 50 must be alternately switched between the $Q_m$ output line 56 and the $I_m$ output line 54. This switching function may be accomplished by a switching circuit 52.

However, the signs on $r(t_m)$ and $\hat{r}(t_m + \tfrac{1}{4}f_o')$ from filter 48 will not necessarily be the correct signs for $I_m$ and $Q_m$. Accordingly, in order to ensure the correctness of the sign for each $I_m$ and $Q_m$ term, the signs therefor may be set in accordance with the following assignment rules:

$$r(t_m) = (-1)^{m/2} I(t_m), \text{ for m even}$$

$$r(t_m) = (-1)^{(m-1)/2} Q(t_m), \text{ for m odd}$$

$$r(t_m + \tfrac{1}{4}f_o') = -(-1)^{m/2} Q(t_m), \text{ for m even, and}$$

$$\hat{r}(t_m + \tfrac{1}{4}f_o') = (-1)^{(m-1)/2} I(t_m), \text{ for m odd.}$$

The foregoing sign assignments may be accomplished quite simply by providing a $+r(t_m)$ and a $-r(t_m)$ output value for each sample on the lines 48(A) and 49(B), respectively, while providing a $+\hat{r}(t_m + \tfrac{1}{4}f_o')$ and a $-\hat{r}(t_m + \tfrac{1}{4}f_o')$ value for each interpolation term on the lines 50(C) and 51(D), respectively. A pair of state-of-the-art commutating switches 53 and 55 with four inputs each may then be utilized in the switch block 52 to provide $r(t_m)$ and $r(t_m + \tfrac{1}{4}f_o')$ with the proper sign to the appropriate $I_m$ and $Q_m$ outputs 54 and 56. The positive and negative values for $r(t_m)$ and $r(t_m + \tfrac{1}{4}f_o')$ may be realized simply by applying the values $r(t_m)$ and $r(t_m + \tfrac{1}{4}f_o')$ to buffer registers (the registers 80 and 76 shown in FIG. 3) and then taking two output lines from each register, with one of the two output lines having its sign bit changed to represent the negative sign. Such buffer registers are normally provided in FIR digital filters and in the present instance, are also utilized to provide appropriate delays so that the $\pm r(t_m)$ outputs A and B are held for a sufficient time to permit $\hat{r}(t_m + \tfrac{1}{4}f_o')$ to be processed.

The outputs A($r(t_m)$), B($-r(t_m)$), C($\hat{r}(t_m + \tfrac{1}{4}f_o')$), and D($-\hat{r}(t_m + \tfrac{1}{4}f_o')$) are then applied to the four inputs of each of the commutating switches 53 and 55 in the sequence shown, namely A, C, B, D and D, A, C, B, respectively. The application of the outputs A, B, C and D in these sequences will realize the four sign assignment equations set forth above. The two switches 53 and 55 are switched through their sequence of inputs in accordance with the sampling frequency $f_s$ on line 44. The operation of the two commutating switches 53 and 55 to provide the correct signal to the lines 54 and 56 with the proper sign is demonstrated in Table I below.

TABLE I

| m | $I_m$ | $Q_m$ |
|---|---|---|
| 0 | r(t₀) | $-\hat{r}(t_o + \tfrac{1}{4}f_o')$ |
| 1 | $\hat{r}(t_1 + \tfrac{1}{4}f_o)$ | r(t₁) |
| 2 | $-r(t_2)$ | $\hat{r}(t_2 + \tfrac{1}{4}f_o)$ |
| 3 | $-\hat{r}(t_3 + \tfrac{1}{4}f_o)$ | $-r(t_3)$ |
| 4 | r(t₄) | $-\hat{r}(t_4 + \tfrac{1}{4}f_o)$ |
| . | . | . |
| . | . | . |
| . | . | . |

Figure 3:
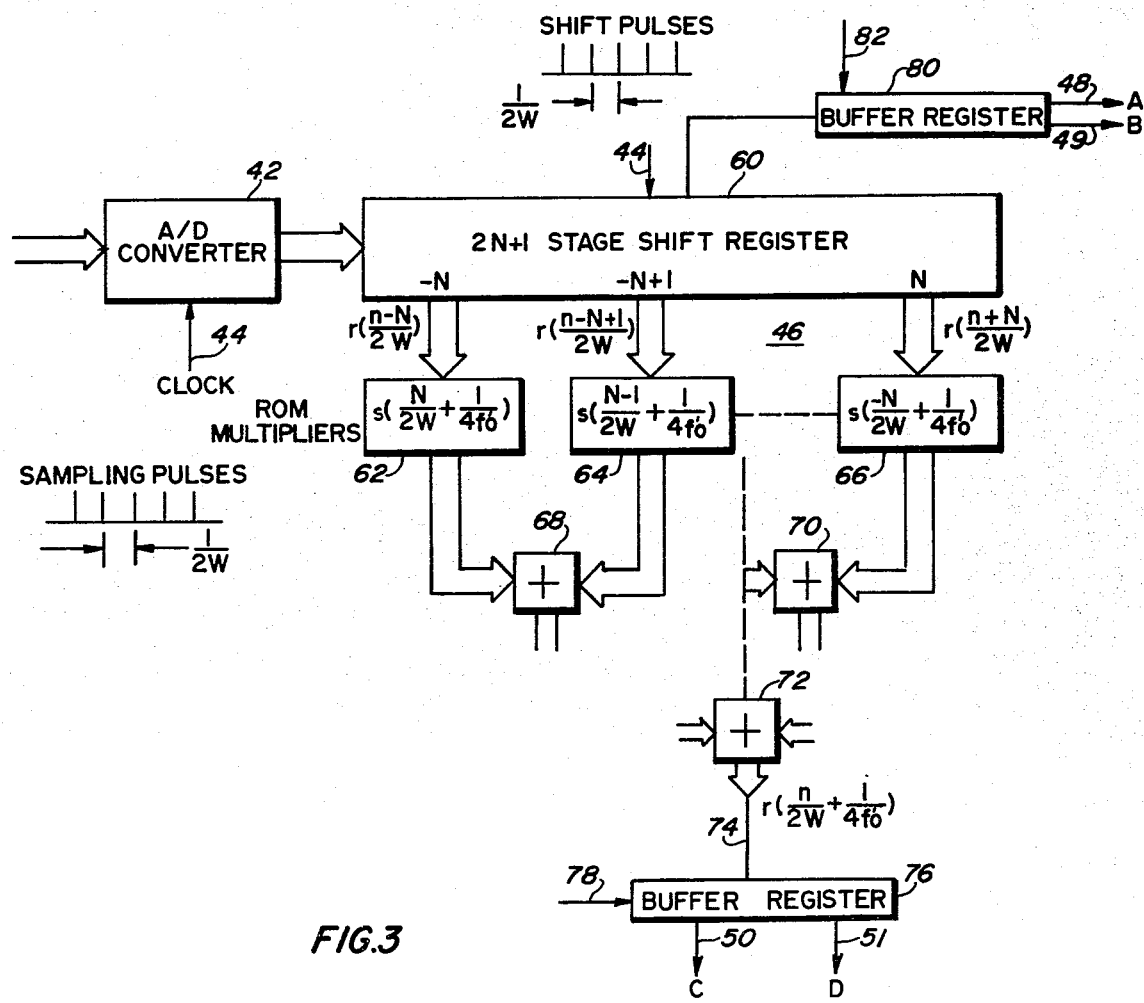
FIG. 3 is a block diagram illustrating the operation of the FIR digital filter shown in FIG. 2.

A digital filter 46 to realize the summation of equation (4) for $\hat{r}(t)$ can be implemented with a 2N+1 stage shift register and a plurality of ROM multipliers as shown in FIG. 3. The 2N+1 stage shift register 60 shifts the digitized samples from the A/D converter 42 serially through its 2N+1 stages labeled from −N to +N in accordance with the sampling frequency rate on line 44. It can be seen that using this designation system, the O stage will be the center stage and will have +N samples stored ahead of it in the register and −N samples stored behind it in the register. Accordingly, the summation operation of equation (4), namely $$\hat{r}(t) = \sum_{-N}^{N} r(n/2W) s(t - n/2W),$$

can be realized for each sample shifted into the center stage O. Each sample from the 2N+1 samples must be multiplied by the sampling function $s(t - n/2W)$ of equation (3). This sampling function multiplication is accomplished by the plurality of ROM multipliers 62, 64, and 66 (one for each sample stage in the shift register).

Accordingly, each sample $r(t_m)$ is multiplied by the sampling function as shown in the figure and the resultant digital numbers are progressively added in a plurality of adders represented by the adders 68, 70 and 72 to yield a single summation term on line 74 of $$\hat{r}(t) = \sum_{-N}^{N} r(n/2W) s(t - n/2W).$$

This estimate $\hat{r}(t_m + \tfrac{1}{4}f_o')$ is stored in a buffer register 76, as noted above, until it is time to be read out on lines 50 and 51 in accordance with a clock switching pulse on line 78. Likewise, the sampled value $r(t_m)$ to be paired with the estimated value $\hat{r}(t_m + \tfrac{1}{4}f_o')$ is applied from the appropriate stage in the shift register 60 where it is being stored into a buffer register 80. The value stored in the buffer register 80 will be read out on to lines 48 and 49 in accordance with a switching clock pulse applied to the register 80 via line 82. The clock frequencies on the line 78 and 82 are developed simply by applying the sampling frequency $f_s$ applied to the shift register to appropriately phased multivibrators to obtain the desired clocking frequency.

A straight-forward implementation of the digital filter 46 would require 115,040 bits for a 10-bit word size digital coherent detector. The amount of memory required can be reduced to 13,440 bits by modifying equation (4) as follows:

$$\hat{r}(t) = \sum_{-N}^{+N} r(n/2W) s(t - n/2W) =$$

-continued $$+\sum_{+N+J(A)}^{+N+J(A)} r_1(n/2W) s(t - n/2W)$$

$$+\sum_{+N+J(A)}^{+N+J(A)} r_2(n/2W) s(t - n/2W)$$

A suitable division of $r(n/2W)=r_1(n/2W)+r_2(n/2W)$ to facilitate a reduction in the number of ROM address bits is as follows:
If $$r(n/2W) = a_9 2^9 + a_8 2^8 a_7 2^7 + a_6 2^6 + a_5 2^5 + a_4 2^4 + a_3 2^3 + a_2 2^2 + a_1 2^1 + a_0 2^0$$

Then $r_1(n/2W) = a_9 2^9 + a_8 2^8 + a_7 2^7 + a_6 2^6 + a_5 2^5$ (5)

$r_2(n/2W) = a_4 2^4 + a_3 2^3 + a_2 2^2 + a_1 2^1 + a_0 2^0$ (6)

This arbitrary choice of setting the five LSB's of $r(n/2W)$ to zero to create $r_1(n/2W)$, and the five MSB's to zero to create $r_2(n/2W)$ permits the generation of the desired product term for each sample by means of two ROM's of 32 words each (zero bits suppressed in addressing) and one 10-bit adder. This operation contrasts with one ROM of 1024 words per sample product term required for use with 10-bit digital words.

Figure 4:
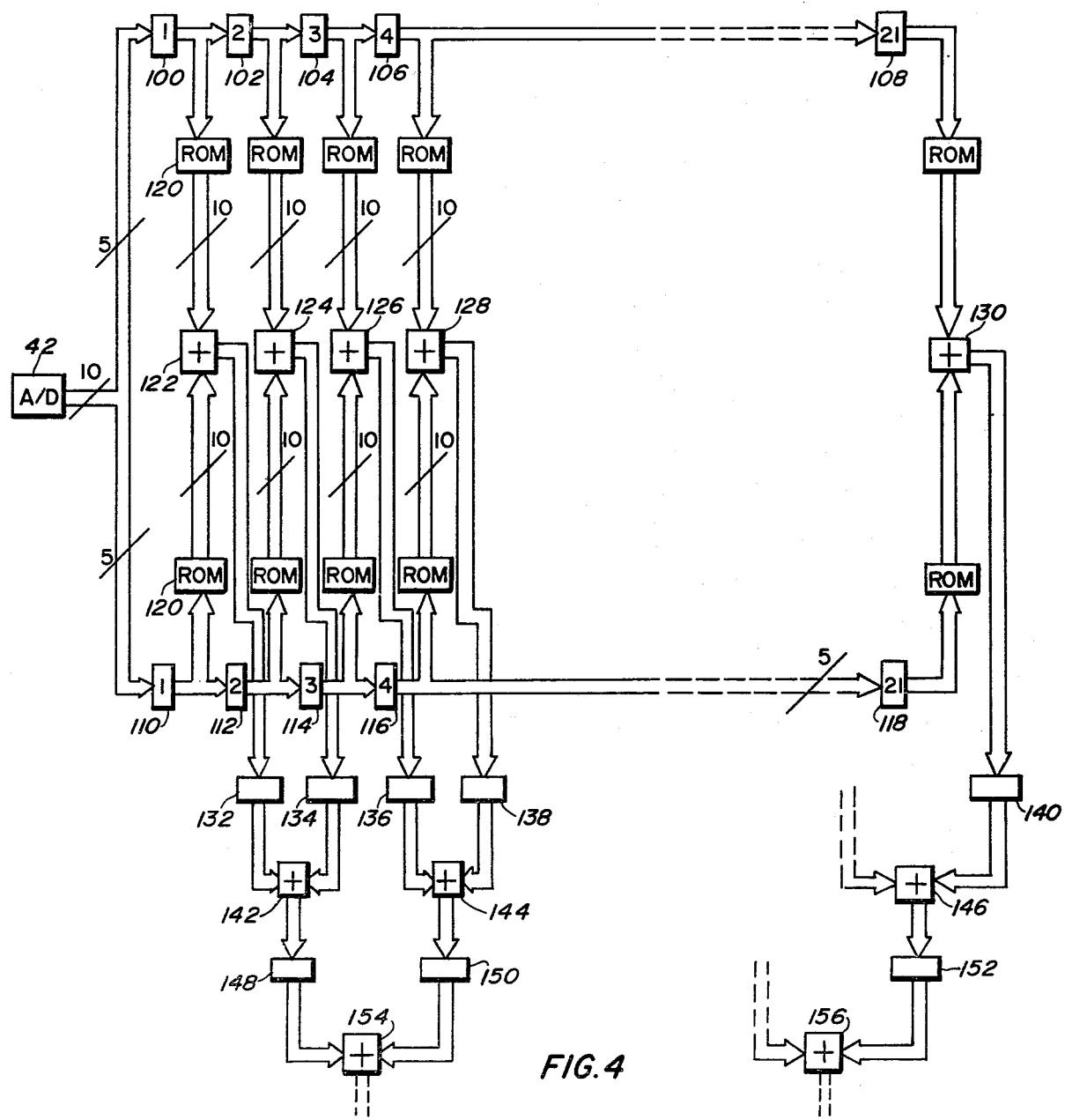
FIG. 4 is a block diagram representation of a reduced ROM configuration which may be utilized to implement the FIR digital filter of FIG. 2.

A digital filter design implementing the foregoing memory-reduction design is shown in FIG. 4. The shift register 60 of FIG. 3 is now implemented by two shift registers comprising the stages 100, 102, 104, 106, ... 108, and the stages 110, 112, 114, 116, ... 118, respectively. Each of these stages has a 5-bit capacity. A 10-bit digital word from the A/D converter 42 is divided into two 5-bit words in accordance with the functions for $r_1(n/2W)$ and $r_2(n/2W)$ shown in equations (5) and (6), respectively. Each of the shift register stages has its own ROM multiplier 120 for multiplying the 5-bit sample word by the sampling function of equation (3). The product terms from each pair of stages storing the $r_1(n/2W)$ and $r_2(n/2W)$ functions for a given digital word $r(n/2W)$ are then added in the adders 122, 124, 126, 128, ... 130 to yield a 10-bit words representative of the $r(n/2W)s(t-n/2W)$ products. For example, the products from the ROM's following the stages 100 and 110 are added to yield a 10-bit word for stage 1. Each 10-bit word for a particular stage is then stored in one of the buffer registers 132, 134, 136, 138, ... 140 and then clocked out to be added to another 10-bit word in the adders 142, 144, ... 146. For example, the 10-bit words from the adders 122 and 124 are added together in the adder 142. The sums from each of the adders 142, 144, ... 146 are stored in buffer registers 148, 150, ... 152 and then added together in the adders 154, ... 156 in the same manner as before. This progressive addition will yield the desired summation of equation (4).

From the foregoing it can be seen that a digital coherent detector has been developed with significantly greater accuracy and a reduction of hardware over prior art coherent detectors. In particular, the standard quadrature channel IF-to-baseband downconverter has been replaced by an A/D converter, a digital filter, and a switching circuit. The $I_m$ and $Q_m$ coefficients are obtained in the present system by utilizing a specific sampling frequency which will cause the sin and cos sinusoids to go alternately to zero and one, thereby yielding $I_m$ and $Q_m$, alternately. The missing coefficient term is then calculated in a digital filter by means of a sampling interpolation summation. These pairs of values $I_m$, $Q_m$ may be used in radar and communications to represent a signal coherently either to define samples of each term given in Eqn (1) (second line) or to compute samples of A(t), where $A_m=(I_m^2+Q_m^2)^{\frac{1}{2}}$ and $\emptyset(t_m)=\text{Tan}^{-1}Q_m/I_m$. Alternatively, such signals may be represented by a complex sample, $R_m=I_m+jQ_m$.

It has been found that very accurate samples can be obtained from sine wave input signals at frequencies well above the A/D converter sampling rate, i.e., up to 20 MHz for the A/D converter tested. (This converter was rated at 5 MHz maximum sampling rate.) Such sampling accuracy and the attendant phase accuracy resulting therefrom permits radar sidelobe cancellation ratios theoretically exceeding 40 dB.

It should be noted that the present digital coherent detector can be used on all incoming IF signals whether phase or amplitude modulated.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A digital coherent detector for directly sampling an I.F. signal to obtain its I and Q coefficients comprising:

means for sampling and digitizing an analog bandpass signal $r(t)=I(t) \cos 2\pi f_0 t - Q(t) \sin 2\pi f_0 t$ at a sampling frequency of $f_s=2f_0/(M-\frac{1}{2})=2W$ so that the sin and cos sinosoidal terms alternately go to zero and one, respectively, such that samples $r(t_m)$ are alternately equal to I(t) and then Q(t), where M is an integer, W is the bandwidth of the input signal, I(t) and Q(t) are the in-phase and quadrature coefficient of the signal, and $f_o$ is the center frequency of the signal and equals $(2M-1)W/2$;

estimating means connected to the output of said sampling and digitizing means for determining an estimate $\hat{r}(t_m)$ for the coefficient whose sin or cos sinosoidal term has gone to zero in a given sample from the N preceding and the N succeeding sampled signals;

an I output line;

a Q output line; and switching means for switching between the I and Q output lines in accordance with the sampling frequency clock pulse alternate samples $r(t_m)$ with appropriate signs, while switching with appropriate sign the estimate signal $\hat{r}(\sim t_m)$ to be paired with each $r(t_m)$ signal to the I or Q output line not connected to take the $r(t_m)$ signal on that clock pulse.

2. A digital coherent detector as defined in claim 1, wherein said estimating means includes means for determining $\hat{r}(\sim t_m)$ for a given sample by making the determination at the time $t_m+1/(4f_o')$, where $f_o'$ is defined identically as $f_o$ but has a higher M integer value.

3. A digital coherent detector as defined in claim 2, wherein said estimating means determines the estimate $\hat{r}(t_m+\frac{1}{4}f_o')$ utilizing the equation $$\hat{r}(t) = \sum_{-N+J(t)}^{N+J(t)} r(n/2W)s(t - n/2W)$$

where J(t) is the largest integer less than or equal to $(t+\frac{1}{4}W)$, N is an integer, and $s(t-n/2W)$ is a sampling function.

4. A digital coherent detector as defined in claim 3, wherein the sampling function s(t−n/2W) for said estimating means is defined as $$s(t - n/2W) = \left[\frac{\sin(2\pi(q/p)W(t - n/2W))}{2\pi(q/p)W(t - n/2W)}\right]^p \cdot$$

$$\frac{\sin(2\pi MW(t - n/2W)) - \sin(2\pi(M - 1)W(t - n/2W))}{2\pi W(t - n/2W)}$$

where q=1−B/W, p=INT (Nq π/e), B is the signal bandwidth, and e is the natural logarithm base.

5. A digital coherent detector as defined in claims 3 or 4, wherein said estimating means comprises:
first 2N+1 stage shift register means for storing sampled signals;
a plurality of multipliers, one for each stage in said shift register means for determining the value r(n/2W)s(t−n/2W) for each of the 2N+1 samples from −N+J(t) to +N+J(t); and
means for adding the values of r(n/2W)s(t−n/2W) for the 2N+1 samples to yield the estimated value $$\hat{r}(t) = \sum_{-N+J(t)}^{N+J(t)} r(n/2W)s(t - n/2W).$$

6. A digital coherent detector as defined in claim 5, wherein said first 2N+1 stage shift register means comprises a second and third 2N+1 stage shift registers having reduced bit capacity stages, with each stage from said second shift register paired with a different stage from said third shift register such that the digital word bits representing a given sample r(n/2W) may be divided between the stages forming a given stage pair; and
wherein said plurality of multipliers includes a reduced bit capacity multiplier for each stage of said second and third shift registers for determining the value r(n/2W)s(t−n/2W) for that stage; and
wherein said adding means includes means for properly adding together the product values from the reduced bit capacity multipliers for a given stage pair which are processing different portions of the same digital word and then progressively adding the different digital words together to obtain $$\hat{r}(t) = \sum_{-N+J(t)}^{N+J(t)} r(n/2W)s(t - n/2W).$$

7. A digital coherent detector as defined in claim 5, wherein said estimating means includes
a first storage means for storing r($t_m$) and providing r($t_m$) and −r($t_m$) on output lines A and B, respectively; and
a second storage means for storing the digital value $\hat{r}(t_m+\frac{1}{4}f_o')$ and providing $\hat{r}(t_m+\frac{1}{4}f_o')$ and −$\hat{r}(t_m+\frac{1}{4}f_o')$ on output lines C and D, respectively.

8. A digital coherent detector as defined in claim 5, wherein said switching means includes means for properly assigning positive and negative signs to r($t_m$) and $\hat{r}(t_m+\frac{1}{4}f_o')$ according to the following equations:

r($t_m$)=(−1)$^{m/2}$I($t_m$), for m even, r($t_m$)=(−1)$^{(m−1)/2}$Q($t_m$), for m odd, $\hat{r}(t_m+\frac{1}{4}f_o')$=−(−1)$^{m/2}$Q($t_m$), for m even, and $\hat{r}(t_m+\frac{1}{4}f_o')$=(−1)$^{(m−1)/2}$I($t_m$), for m odd.

9. A digital coherent detector as defined in claim 7, wherein said switching means comprises first and second four-input commutating switches with their inputs connected to the A, B, C, and D lines from said first and second storage means, and with their outputs connected to said I and Q output lines, respectively, for applying thereto r($t_m$), −r($t_m$), r($t_m+\frac{1}{4}f_o'$) and −r($t_m+\frac{1}{4}f_o'$), as appropriate.

10. A digital coherent detector as defined in claim 9, wherein the lines A, B, C, and D are connected to the inputs for said first commutating switch in the order A, C, B, D, and are connected to the inputs for said second commutating switch in the order D, A, C, B.

11. A digital coherent detector for directly sampling an I.F. signal to obtain its I and Q coefficients comprising:
means for sampling and digitizing an analog bandpass signal r(t)=I(t) cos 2π$f_o$t−Q(t) sin 2π$f_o$t at a sampling frequency of $f_s$=2$f_o$/(M−$\frac{1}{2}$)=2W so that the sin and cos sinosoidal terms alternately go to zero and one, respectively, such that samples r($t_m$) are alternately equal to I(t) and then Q(t), where M is an integer, W is the bandwidth of the input signal, I(t) and Q(t) are the in-phase and quadrature coefficients of the signal, and $f_o$ is the center frequency of the signal and equals (2M−1)W/2;
a finite impulse response digital filter connected to the output of said sampling and digitizing means for determining an estimate $\hat{r}(\sim t_m)$ for the coefficient whose sinosoidal term has gone to zero for a given sample r($t_m$), utilizing the equation $$\hat{r}(t) = \sum_{-N+J(t)}^{N+J(t)} r(n/2W)s(t - n/2W)$$

where J(t) is the largest integer less than or equal to t+$\frac{1}{4}$W, N is an integer number of samples, and s(t−n/2W) is a sampling function, and wherein the times used for the determination are t=$t_m$+$\frac{1}{4}f_o'$ where $f_o'$=(2M′−1)W/2, with M′ being an integer >>M;
an I output line;
a Q output line; and
switching means for properly setting the signs for r($t_m$) and $\hat{r}(\sim t_m)$ and alternately switching these terms between said I and Q output lines in accordance with a clock pulse.

12. A digital coherent detector as defined in claim 11, wherein said FIR digital filter comprises:
2N+1 stage shift register means for storing and shifting sampled signals;
a plurality of ROM multipliers, one for each stage in said shift register means for determining the value r(n/2W)s(t−n/2W) for each of the samples from −N+J(t) to +N+J(t);
means for adding the values of r(n/2W)s(t−n/2W) for the samples from −N+J(t) to +N+J(t) to yield $\hat{r}(t_m+\frac{1}{4}f_o')$;
a first buffer register connected to the appropriate stage in said 2N+1 stage shift register means for storing r($t_m$) and providing +r($t_m$) and −r($t_m$) outputs to said switching means;
a second buffer register for storing $\hat{r}(t_m+\frac{1}{4}f_o')$ and providing $\hat{r}(t_m+\frac{1}{4}f_o')$ and −$\hat{r}(t_m+\frac{1}{4}f_o')$ outputs to said switching means; and
wherein said switching means applies the appropriate outputs from r($t_m$), −r($t_m$), $\hat{r}(t_m+\frac{1}{4}f_o')$, and −$\hat{r}(t_m+\frac{1}{4}f_o')$ to said I and Q output lines.

* * * * *